United States Patent
Kataoka

(10) Patent No.: US 8,148,625 B2
(45) Date of Patent: Apr. 3, 2012

(54) COMPOSITION FOR SOLAR CELL SEALING FILM, SOLAR CELL SEALING FILM AND SOLAR CELL USING THE SEALING FILM

(75) Inventor: Hisataka Kataoka, Kanagawa (JP)

(73) Assignee: Bridgestone Corporation, Tokyo (JP)

( * ) Notice: Subject to any disclaimer, the term of this patent is extended or adjusted under 35 U.S.C. 154(b) by 509 days.

(21) Appl. No.: 12/376,382

(22) PCT Filed: Aug. 22, 2007

(86) PCT No.: PCT/JP2007/066238
§ 371 (c)(1),
(2), (4) Date: Feb. 4, 2009

(87) PCT Pub. No.: WO2008/023722
PCT Pub. Date: Feb. 28, 2008

(65) Prior Publication Data
US 2010/0229946 A1      Sep. 16, 2010

(30) Foreign Application Priority Data
Aug. 23, 2006  (JP) ................................. 2006-227053

(51) Int. Cl.
*H01L 31/042* (2006.01)
*C08F 20/28* (2006.01)
*C08F 290/04* (2006.01)

(52) U.S. Cl. ........ 136/243; 136/244; 136/245; 136/246; 136/247; 136/248; 136/249; 136/250; 136/251; 136/252; 136/253; 136/254; 136/255; 136/256; 136/257; 136/258; 136/259; 136/260; 136/261; 136/262; 136/263; 136/264; 136/265; 428/323; 428/327

(58) Field of Classification Search .......... 136/243–265; 428/323, 327
See application file for complete search history.

(56) References Cited

FOREIGN PATENT DOCUMENTS

| JP | 61-009444 A | 1/1986 |
| JP | 7-202243 A | 8/1995 |
| JP | 8-216317 A | 8/1996 |
| JP | 11-026791 | * 1/1999 |
| JP | 11-26791 A | 1/1999 |
| JP | 3473605 B | 12/2003 |
| JP | 2005-029588 A | 2/2005 |

OTHER PUBLICATIONS

Patent Abstract (English Language) of JP 61-009444, Kenmotsu et al, Jan. 17, 1986, Abstract Only, pp. 1-2.*
English Translation of JP 11-026791, Sakai et al, Jan. 29, 1999, pp. 1-8.*

* cited by examiner

*Primary Examiner* — Brian P Mruk
(74) *Attorney, Agent, or Firm* — Sughrue Mion, PLLC

(57) ABSTRACT

The present invention provides a solar cell sealing film having enhanced transparency. A composition for a solar cell sealing film contains an ethylene-polar monomer copolymer, a crosslinker and a compound having an alkyleneoxy group. Thereby a solar cell sealing film having excellent all light beam transmittance and enhanced transparency can be formed.

8 Claims, 1 Drawing Sheet

COMPOSITION FOR SOLAR CELL SEALING FILM, SOLAR CELL SEALING FILM AND SOLAR CELL USING THE SEALING FILM

BACKGROUND OF INVENTION

1. Field of the Invention

The present invention relates to a composition for a solar cell sealing film consisting chiefly of ethylene-polar monomer copolymer which is suitably utilized in preparation of a solar cell.

2. Description of the Related Art

A solar cell (solar cell module) has been widely employed as a device directly converting solar energy into electric energy from the view-points of effective use of natural resources and ecology, and is further developed.

As shown in FIG. 1, a solar cell has a structure that plural photovoltaic elements 14 (e.g., photovoltaic elements made of silicon) are sealed through a front side sealing film 13A and a backside sealing film 13B between a transparent front side protection material 11 and a backside protection material 12 (backside covering member).

In a conventional solar cell, a transparent substrate such as a glass plate is used as the transparent front side protection material such that light incident upon the solar cell is effectively taken into the photovoltaic elements of the solar cell as much as possible. In contrast, a plastic film such as polyethylene terephthalate (PET) or a plastic film having a silver-deposited layer thereon is used as backside protection material in order to prevent water from invading the inside of the solar cell.

As a front side sealing film or a backside sealing film, a film made of ethylene-polar monomer copolymer such as ethylene-vinyl acetate copolymer (EVA) or ethylene-ethylacrylate copolymer (EEA) is used. The ethylene-vinyl acetate copolymer is preferably used in a conventional solar cell because it has low cost and high transparency.

A solar cell (module) is generally prepared by extending an EVA composition comprising EVA and a crosslinker by the application of pressure and heat to form a sealing film, and thereafter superposing a transparent front side protection material, a front side sealing film, photovoltaic elements, a back side sealing film and a backside protection material in this order and curing or crosslinking EVA by heating under pressure at temperature of 135 to 180° C. to combine them.

The conventional solar cell sealing film is crosslinked by using a crosslinker in addition to ethylene-polar monomer copolymer to enhance crosslink density for the purpose of improvement of the strength or durability (Patent Document 1). As a method to activate the crosslinker, a thermal decomposition method, a redox decomposition method and an ion decomposition method are known. The thermal decomposition method is generally used.

Patent Document 1: Japanese Patent Number 3,473,605

SUMMARY OF THE INVENTION

Problem to be Solved by the Invention

Though a solar cell has become widely used as residential electric generating system, it is expected that the solar cell is also widely used in industrial electric generating system due to clean energy. To further promote the use of solar cell, it is required to develop a high power and high voltage type solar cell that is enhanced in generating efficiency.

In order to enhance the generating efficiency of the solar cell, it is necessary that light is effectively caused to be incident upon the solar cell whereby the incident light is taken into the photovoltaic elements of the solar cell as much as possible. For this, use of a sealing film having high transparency in the solar cell is effective. Herefore, though ethylene-polar monomer copolymer such as ethylene-vinyl acetate copolymer (EVA) or ethylene-ethylacrylate copolymer (EEA) having high transparency is used in the solar cell, a sealing film having further high transparency is desired so as to obtain high power.

In view of the above viewpoints, the object of the present invention is to provide a solar cell sealing film having high transparency.

Means for Solving Problem

As a result of the present inventor's various studies on the problem, the inventor has found that the solar cell sealing film formed by using a specific compound having excellent compatibility with ethylene-polar monomer copolymer has further high transparency.

In more detail, the present object is solved by the present invention, i.e., a composition for a solar cell sealing film comprising ethylene-polar monomer copolymer, a crosslinker and a compound having an alkyleneoxy group.

The preferred embodiments of the sealing film for a solar cell according to the present invention are described as follows:

(1) The compound having an alkyleneoxy group is represented by the following formula (1):

[Formula 1]

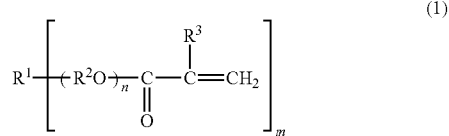

in which $R^2$ represents a substituted or unsubstituted alkylene group, $R^3$ represents a hydrogen atom or a methyl group, n is an integer of 1 to 30, m is an integer of 1 to 3, $R^1$ represents an alkoxy group, an aryloxy group, a phosphoric acid group, a phosphate ester (phosphoric acid ester) group, a methacryloyl-ethoxy phosphoric acid group, a acryloyl-ethoxy phosphoric acid group, an acryloyloxy group or a methacryloyloxy group provided that m is 1, $R^1$ represents a divalent aliphatic hydrocarbon group provided that m is 2, and $R^1$ represents a trivalent aliphatic hydrocarbon group provided that m is 3.

(2) The $R^2$ of the formula (1) represents an ethylene group or a group represented by —$CH_2CH(CH_3)$—.

(3) The n of the formula (1) is an integer of 1 to 16.

(4) The m of the formula (1) is 1 and $R^1$ represents an acryloyloxy group or a methacryloyloxy group.

(5) The compound having an alkyleneoxy group is contained in the amount of 0.01 to 5 parts by weight based on 100 parts by weight of the ethylene-polar monomer copolymer.

(6) The ethylene-polar monomer copolymer is ethylene-vinyl acetate copolymer.

Effect of the Invention

The use of the composition of solar cell sealing film according to the present invention enables the formation of a solar cell sealing film having excellent all light beam transmittance and high transparency. A solar cell provided with this solar cell sealing film acquires high generating efficiency and shows high electric power supply from the start of electric generation.

DESCRIPTION OF THE REFERENCE NUMBERS

Figure 1:
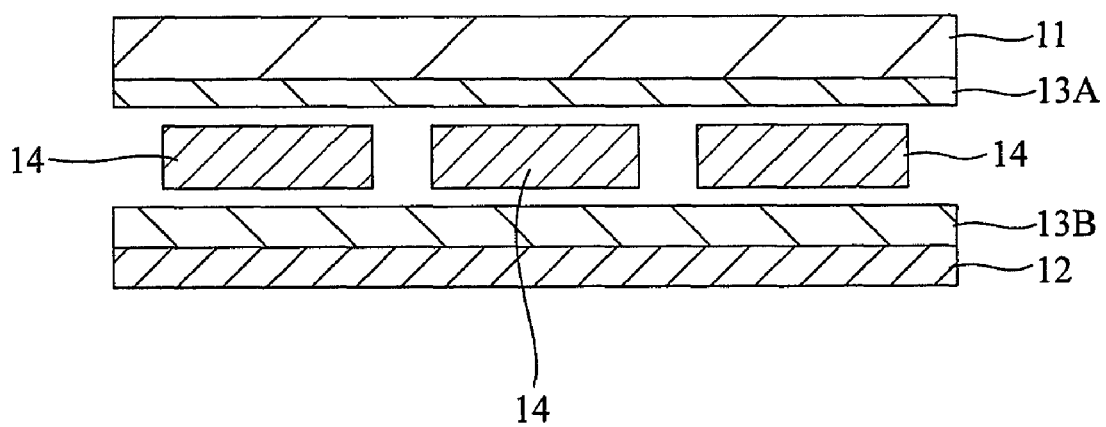
FIG. 1 is a section view of a conventional solar cell.

11: transparent front side protection material
12: backside protection material
13A: front side sealing film
13B: backside sealing film
14: photovoltaic element

DETAILED DESCRIPTION OF THE INVENTION

A composition for a solar cell sealing film of the present invention includes ethylene-polar monomer copolymer, a crosslinker and a compound having an alkyleneoxy group as basic components. The solar cell sealing film prepared by using the specific compound having an alkyleneoxy group shows high transparency. The use of the composition of the invention enables the formation of a solar cell sealing film having high transparency without impairing the properties required to the sealing film such as electric insulation, sealing property, flexibility and heat and humidity resistance brought about by the use of ethylene-polar monomer copolymer.

The composition for a solar cell sealing film of the present invention is explained in detail below.

<Compound Having Alkyleneoxy Group>

The composition of the invention contains a compound having at least one alkyleneoxy group. Examples of the compound include those described below, and any known compounds such as polyethylene oxide and polypropylene oxide provided that they have an alkyleneoxy group.

It is preferred to use as the above-mentioned compound a compound having an alkyleneoxy group and carbon-carbon double bond as well because the compound brings about a solar cell sealing film having excellent transparency without lowering of other properties. Though the carbon-carbon double bond (—C=C—) may be present in any location of the compound, the double bond is preferably positioned at the end of the molecule of the compound in view of the reactivity and the productivity. Preferred examples of the groups having the carbon-carbon double bond include a (meth)acryloyl group and a (meth)acryloyloxy group, especially a (meth)acryloyl group.

The compound having an alkyleneoxy group is preferably represented by the following formula (1):

[Formula 2]

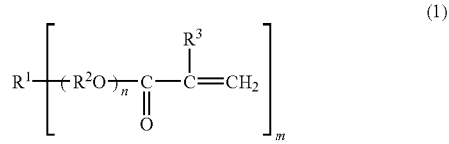

(1)

in which $R^2$ represents a substituted or unsubstituted alkylene group, $R^3$ represents a hydrogen atom or a methyl group, n is an integer of 1 to 30, m is an integer of 1 to 3, $R^1$ represents an alkoxy group, an aryloxy group, a phosphoric acid group, a phosphate ester (phosphoric acid ester) group, a methacryloyl-ethoxy phosphoric acid group, a acryloyl-ethoxy phosphoric acid group, an acryloyloxy group or a methacryloyloxy group provided that m is 1, $R^1$ represents a divalent aliphatic hydrocarbon group provided that m is 2, and $R^1$ represents a trivalent aliphatic hydrocarbon group provided that m is 3.

$R^2$ of the formula (1) is a substituted or unsubstituted alkylene group. $R^2$ is preferably a substituted or unsubstituted alkylene group having 1 to 40 carbon atoms, further 1 to 30 carbon atoms, especially 1 to 15 carbon atoms. Examples of the alkylene group include a methylene group, an ethylene group, a trimethylene group, a tetramethylene group, a propylene group, a butylene group, a hexamethylene group, an octamethylene group, a decamethylene group, a undecamethylene group, a dodecamethylene group, a tridecamethylene group, a tetradecamethylene group, a pentadecamethylene group, a hexadecamethylene group, a heptadecamethylene group and a octadecamethylene group.

The substituted group of the unsubstituted alkylene group is preferably an alkyl group having 1 to 10 carbon atoms. Examples of the substituted groups include a methyl group, an ethyl group, a propyl group, an isopropyl group, a butyl group, a tert-butyl group, a pentyl group, a neopentyl group and a hexyl group.

$R^2$ of the formula (1) is further preferably an ethylene group or a group represented by —$CH_2CH(CH_3)$—. These groups have little negative effect on the main chain of ethylene-polar monomer copolymer, and therefore a solar cell sealing film having high transparency can be easily obtained.

"n" of the formula (1) represents a mean adduct mole number of ethylene oxide, which is an integer of 1 to 30, preferably 1 to 16, more preferably 4 to 12. Thereby, blocking phenomena, that is generated between sealing films contacted with each other when the film is prepared to be wound around a roll, is apt not to occur and therefore a solar cell sealing film having high transparency can be easily obtained.

"m" of the formula (1) is an integer of 1 to 3. When m is 1, $R^1$ generally represents an alkoxy group, an aryloxy group, an acryloyloxy group or a methacryloyloxy group.

The alkoxy group of $R^1$ preferably is alkoxy having 1 to 10 carbon atoms. Examples of the alkoxy group include an ethoxy group, a methoxy group, a propoxy group, a butoxy group and a isooctyloxy group, especially an ethoxy group.

The aryloxy group of $R^1$ preferably is alkoxy having 6 to 20 carbon atoms. Examples of the alkoxy group include a phenoxy group, a benzyloxy group and a naphthoxy group, especially a phenoxy group.

$R^1$ may be a phosphoric acid group (—O—$PO(OH)_2$), a phosphate ester (phosphoric acid ester) group [—O—PO(OM)OH or —O—$PO(OM)_2$; in which M is an alkyl group having 1 to 10 carbon atoms, especially 1 to 6 carbon atoms], a methacryloyl-ethoxy phosphoric acid group [$CH_2$=C($CH_3$)COO($CH_2$)$_2$—O—PO(OH)—O-], a acryloyl-ethoxy phosphoric acid group [$CH_2$=CHCOO($CH_2$)$_2$—O—POOH)—O-].

In the formula (1), when m is 2, $R^1$ represents a divalent aliphatic hydrocarbon group, which is generally a linear or branched alkylene group having 1 to 14 carbon atoms, especially 1 to 8 carbon atoms. Examples of the divalent aliphatic hydrocarbon group include preferably a methylene group, an ethylene group, an ethylidene group, a trimethylene group, a propylene group (1,2-propandiyl), an isopropylidene group, a tetramethylene group, an ethylethylene group, a pentamethylene group, a hexamethylene group, a heptamethylene group and an octamethylene group.

The divalent aliphatic hydrocarbon group may have 1 to 4 substituted groups. The substituted group is preferably an alkyl group having 1 to 6 carbon atoms.

In the formula (1), when m is 3, $R^1$ represents a trivalent aliphatic hydrocarbon group. The trivalent aliphatic hydrocarbon group is preferably a group represented by the following formula (2):

[Formula 3]

(2)

in which $R^4$ represents a hydrogen atom, an alkyl group having 1 to 4 carbon atoms or a hydroxyalkyl group having 1 to 4 carbon atoms.

Further the trivalent aliphatic hydrocarbon group is preferably a group represented by the following formula (3):

[Formula 4]

(3)

In the formula (1), it is especially preferred that m is 1 and $R^1$ is an acryloyloxy group or a methacryloyloxy group. These groups have little negative effect on the main chain of ethylene-polar monomer copolymer, and therefore a solar cell sealing film having high transparency can be easily obtained.

Preferred examples of the compound having the formula (1) include ethylene glycol di(meth)acrylate, polyethylene glycol di(meth)acrylate, propylene glycol di(meth)acrylate, polypropylene glycol di(meth)acrylate, tetramethylene glycol di(meth)acrylate, polytetramethylene glycol di (meth) acrylate, phenoxypolyethylene glycol mono(meth)acrylate, methoxypolyethylene glycol mono(meth)acrylate, mono(2-methacryloyloxyethyl)acid phosphate [$CH_2=C(CH_3)COO(CH_2)_2-O-PO(OH)_2$], mono(2-acryloyloxyethyl)acid phosphate [$CH_2=CHCOO(CH_2)_2-O-PO(OH)_2$], di(2-methacryloyloxyethyl)acid phosphate [$\{CH_2=C(CH_3)COO(CH_2)_2-O\}_2-PO(OH)$], and di(2-acryloyloxyethyl)acid phosphate [$\{CH_2=CHCOO(CH_2)_2-O\}_2-PO(OH)$]. The compounds can be used singly or in combination of two or more kinds.

Of the above-mentioned compounds having alkylene oxide group, the following compounds are preferably used in the composition of the present invention because a solar cell sealing film having high transparency can be easily obtained. Examples of the compounds include preferably ethylene glycol di(meth)acrylate and polyethylene glycol di(meth)acrylate [a mean adduct mole number "n" of ethylene oxide is preferably 2 to 20, especially 2 to 16], especially nanoethylene glycol di(meth)acrylate and tetraethylene glycol di(meth)acrylate.

The term "(meth)acrylate" in the invention means acrylate or methacrylate.

In the composition of the invention, the compound having an alkyleneoxy group is generally contained in the amount of 0.01 to 5 parts by weight, preferably 0.05 to 0.6 part by weight, based on 100 parts by weight of the ethylene-polar monomer copolymer. Use of 5 or less parts by weight of the compound enables repression of bleeding phenomenon that the compound within the sealing film bleeds from the surface of the sealing film over time to impair its appearance and repression of blocking phenomenon. Use of 0.01 or more part by weight of the compound enables sufficiently exhibition of the above-mentioned repression effects.

<Ethylene-Polar Monomer Copolymer>

The composition of the invention contains further ethylene-polar monomer copolymer in addition to the compound having an alkyleneoxy group. Polar monomer of the ethylene-polar monomer copolymer is preferably unsaturated carboxylic acids, salts thereof, esters thereof and amides thereof, vinyl esters and carbon monoxide. Examples of the polar monomer include unsaturated carboxylic acids such as acrylic acid, methacrylic acid, fumaric acid, itaconic acid, monomethyl maleate, monoethyl maleate, maleic anhydride and itaconic anhydride, monovalent metal salts (e.g., lithium, sodium or potassium) of these unsaturated carboxylic acids, and multivalent metal salts (e.g., magnesium, calcium or zinc) of these unsaturated carboxylic acids; unsaturated carboxylic acid esters such as methyl acrylate, ethyl acrylate, isopropyl acrylate, isobutyl acrylate, n-butyl acrylate, isoctyl acrylate, methyl methacrylate, ethyl methacrylate, isobutyl methacrylate and dimethyl maleate; vinyl esters such as vinyl acetate and vinyl propionate; carbon monoxide; and sulfur dioxide. The monomers can be used singly or in combination of two or more kinds.

Examples of the ethylene-polar monomer copolymer include ethylene-unsaturated carboxylic acid copolymers such as ethylene-acrylic acid copolymer and ethylene-methacrylic acid copolymer; ionomers obtained by neutralizing a part or whole of carboxylic acids of ethylene-unsaturated carboxylic acids copolymer by the above-mentioned metals; ethylene-unsaturated carboxylic acid ester copolymers such as ethylene-methyl acrylate copolymer, ethylene-ethyl acrylate copolymer, ethylene-methyl methacrylate copolymer, ethylene-isobutyl acrylate copolymer and ethylene-n-butyl acrylate copolymer; ethylene-unsaturated carboxylic acid ester-unsaturated carboxylic acid copolymers such as ethylene-isobutyl acrylate-methacrylic acid copolymer, ethylene-n-butyl acrylate-methacrylic acid copolymer; ionomers obtained by neutralizing a part or whole of carboxylic acids of ethylene-unsaturated carboxylic acid ester-unsaturated carboxylic acid copolymers by the above-mentioned metals; and ethylene-vinyl ester copolymer such as ethylene-vinyl acetate copolymer.

The ethylene-polar monomer copolymer used in the invention preferably has Melt Flow Rate (according to JIS K 7210) of 35 g/10 min or less, especially 3 to 6 g/10 min. Use of the ethylene-polar monomer copolymer having Melt Flow Rate of the above-mentioned range enables to repress the phenomenon that the sealing film melts and go off the defined location to protrude outside the substrate when the film is heated under pressure in a sealing step for preparation of solar cell.

A value of Melt Flow Rate (MFR) is determined under the conditions of temperature of 190° C. and load of 21.18N according to JIS K 7210.

The ethylene-polar monomer copolymer is most preferably ethylene-vinyl acetate copolymer (EVA), whereby a solar cell sealing film having low cost and excellent transparency and flexibility can be obtained.

In the EVA, the content of vinyl acetate recurring unit generally is in the range of 20 to 35% by weight, preferably 22 to 30% by weight, especially 24 to 28% by weight based on 100 parts by weight of EVA. When the content is less than 20% by weight, the sealing film crosslinked and cured at high temperature does not occasionally show sufficiently high transparency. On the other hand, when the content is more than 35% by weight, the EVA is apt to produce carboxylic acid, alcohol or amine.

<Crosslinker>

The composition of the present invention includes a crosslinker in addition to ethylene-polar monomer copolymer and a compound having an alkyleneoxy group. Use of the crosslinker enables to enhance weather resistance due to high reactivity in crosslinking procedure.

The composition of the invention generally contains organic peroxide or photopolymerization initiator as a crosslinker. The organic peroxide is preferably used because the resultant resin film is improved in temperature dependency in adhesion, transparency, humidity resistance and penetration resistance.

Any organic peroxides that can be decomposed at a temperature of not less than 100° C. to generate radical(s) can be employed as the above-mentioned organic peroxide. The organic peroxide is selected in the consideration of film-forming temperature, conditions for preparing the composition, curing (bonding) temperature, heat resistance of body to be bonded, storage stability. Especially, preferred are those having a decomposition temperature of not less than 70° C. in a half-life of 10 hours.

From the viewpoint of resin processing temperature and storage stability, examples of the organic peroxides include benzoyl peroxide-type cure agent, tert-hexyl peroxypyvalate, tert-butyl peroxypyvalate, 3,5,5-trimethyl hexanoyl peroxide, di-n-octanoyl peroxide, lauroyl peroxide, stearoyl peroxide, 1,1,3,3-tetramethylbutylperoxy-2-ethyl hexanoate, succinic acid peroxide, 2,5-dimethyl-2,5-di(2-ethylhaxanoylperoxy)hexane, 1-cyclohexyl-1-methylethylperoxy-2-ethyl hexanoate, tert-hexylperoxy-2-ethyl hexanoate, 4-methylbenzoyl peroxide, tert-butylperoxy-2-ethyl hexanoate, m-toluoyl+benzoyl peroxide, benzoyl peroxide, 1,1-bis(tert-butylperoxy)-2-methylcyclohexanate, 1,1-bis(tert-hexylperoxy)-3,3,5-trimethylcyclohexanate, 1,1-bis(tert-hexylperoxy)cyclohexanate, 1,1-bis(tert-butylperoxy)-3,3,5-trimethylcyclohexane 1,1-bis(tert-butylperoxy)cyclohexanate, 2,2-bis(4,4-di-tert-butylperoxycyclohexyl)propane, 1,1-bis(tert-butylperoxy)cyclododecane, tert-hexylperoxyisopropyl monocarbonate, tert-butylperoxy maleic acid, tert-butylperoxy-3,3,5-trimethyl hexanoate, tert-butyl peroxylaurate, 2,5-dimethyl-2,5-di(methylbenzoylperoxy)hexane, tert-butylperoxyisopropyl monocarbonate, tert-butylperoxy-2-ethylhexyl monocarbonate, tert-hexyl peroxybenzoate, and 2,5-di-methyl-2,5-di (benzoylperoxy)hexane.

Any benzoyl peroxide-type cure agents that can be decomposed at a temperature of not less than 70° C. to generate radical(s) can be employed as the organic peroxides. Preferred are those having a decomposition temperature of not less than 50° C. in a half-life of 10 hours. The benzoyl peroxide-type cure agents are selected in the consideration of film-forming temperature, conditions for preparing the composition, curing (bonding) temperature, heat resistance of body to be bonded, storage stability.

Examples of the benzoyl peroxide-type cure agents include benzoyl peroxide, 2,5-dimethylhexyl-2,5-bisperoxybenzoate, p-chlorobenzoyl peroxide, m-toluoyl peroxide, 2,4-dichlorobenzoyl peroxide, t-butyl peroxybenzoate and the like. The crosslinkers can be used singly, or in combination of two more kinds.

The crosslinker preferably is in particular 2,5-di-methyl-2,5-di(tert-butylperoxy)hexane. Thereby a solar cell sealing film having excellent transparency can be obtained.

The content of the crosslinker in the composition preferably is in the range of 0.1 to 2 parts by weight, in particular 0.2 to 1.5 parts by weight based on 100 parts by weight of ethylene-polar monomer copolymer. When the content of the cross-linking agent is less, the transparency of the sealing film is apt to be reduced. When the content of the cross-linking agent is excessive, the compatibility of the crosslinker with the copolymer is apt to be reduced.

Any known photopolymerization initiators can be employed as the crosslinker. Preferred are initiators having good storage stability after addition thereof.

Examples of the photopolymerization initiators include acetophenone type such as 2-hydroxy-2-methyl-1-phenylpropane-1-on, 1-hydroxycyclohexylphenylketone, 2-methyl-1-[4-(methylthio)phenyl]-2-morphorino-propane-1-on; benzoin type initiators such as benzylmethylketal; and the benzophenone type initiators such as benzophenone, 4-phenylbenzophenone and hydroxybenzophenone; thioxanthone type initiators such as isopropylthioxanthone and 2,4-diethylhioxanthone. Further, as special type, there can be mentioned methylphenylglyoxylate. Especially preferred are 2-hydroxy-2-methyl-1-phenylpropane-1-on, 1-hydroxycyclohexylphenylketone, 2-methyl-1-[4-(methylthio)phenyl]-2-morphorinopropane-1-on and benzophenone. These photopolymerization initiators can be employed together with one or more kinds of a photopolymerization promoter such as a benzoic acid type compound (e.g., 4-dimethylaminobezoic acid) or a tertiary amine compound by mixing the initiator with the promoter in optional ratio. The initiator can be employed singly or in combination of two or more kinds.

The photopolymerization initiator is preferably contained in the composition in the range of 0.5 to 5.0 parts by weight based on 100 parts by weight of ethylene-polar monomer copolymer.

<Cross-Linking Auxiliary>

The composition for solar cell sealing film may contain cross-linking auxiliary if necessary. The cross-linking auxiliary enables increase of the gel fraction of ethylene-polar monomer copolymer and improvement of the durability of the sealing film.

Examples of the cross-linking auxiliaries (compounds having a radical polymerizable group as functional group) include trifunctional cross-linking auxiliaries such as triallyl cyanurate and triallyl isocyanurate, monofunctional or bifunctional cross-linking auxiliaries of (meth)acryl esters (e.g., NK Ester, etc.). Triallyl cyanurate and triallyl isocyanurate are preferred, and triallyl isocyanurate is particularly preferred.

The content of the cross-linking auxiliary is preferably used in the range of 0.1 to 3.0 parts by weight, more preferably 0.1 to 2.5 parts by weight based on 100 parts by weight of ethylene-polar monomer copolymer.

The composition for solar cell sealing film preferably contains an adhesion improver because the film has excellent adhesion in view of sealing properties inside a solar cell.

Silane-coupling agent can be used as the adhesion improver, whereby a solar cell sealing film having excellent adhesion can be obtained. Examples of the silane coupling agents include γ-chloropropylmethoxysilane, vinylethoxysilane, vinyltris(β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane. These silane coupling agents can be used singly, or in combination of two or more kinds. Especially preferred is γ-methacryloxypropyltrimethoxysilane.

The content of the silane coupling agent preferably is in the range of 0.1 to 0.7 part by weight, especially 0.3 to 0.65 part by weight based on 100 parts by weight of ethylene-polar monomer copolymer.

<Others>

The composition for solar cell sealing film may contain various additives such as plasticizer, acryloxy group-containing compound, methacryloxy group-containing compound and/or epoxy group containing compound for improvement or adjustment of various properties of the film (e.g., mechanical strength, adhesive property (adhesion), optical characteristics such as transparency, heat resistance, light-resistance, cross-linking rate).

Polybasic acid ester and polyvalent alcohol ester can be used as the plasticizer though particularly not restricted. Examples of the plasticizers include dioctyl phthalate, dihexyl adipate, triethylene glycol-di-2-ethyl butyrate, butyl sebacate, tetraethylene glycol diheptanoate and triethylene glycol dipelargonate. The plasticizers can be used singly, or in combination of two or more kinds. The content of the plasticizer preferably is not more than 5 parts by weight based on 100 parts by weight of ethylene-polar monomer copolymer.

Examples of the acryloxy group-containing compounds and methacryloxy group-containing compounds include generally derivatives of acrylic acid or methacrylic acid, such as esters and amides of acrylic acid or methacrylic acid. Examples of the ester residue include linear alkyl groups (e.g., methyl, ethyl, dodecyl, stearyl and lauryl), a cyclohexyl group, a tetrahydrofurfuryl group, an aminoethyl group, a 2-hydroxyethyl group, a 3-hydroxypropyl group, 3-chloro-2-hydroxypropyl group. Example of the amide includes diacetone acryl amide. Further, the esters include esters of acrylic acid or methacrylic acid with polyhydric alcohol such as ethylene glycol, triethylene glycol, polypropylene glycol, polyethylene glycol, trimethylol propane or pentaerythritol.

Examples of the epoxy group containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-tert-butylphenyl glycidyl ether, diglycidyl adipate, diglycidyl phthalate, glycidyl methacrylate and butyl glycidyl ether.

The acryloxy group-containing compound, methacryloxy group-containing compound and epoxy group containing compound each are preferably in the range of 0.5 to 5.0 parts by weight, especially 1.0 to 4.0 parts by weight based on 100 parts by weight of ethylene-polar monomer copolymer.

The composition for solar cell sealing film may further comprise an ultraviolet absorbent, a photostabilizer and an antioxidant additionally.

The composition for solar cell sealing film containing ultraviolet absorbent enables to prevent the ethylene-polar monomer copolymer from deteriorating due to light irradiation to repress yellowing of the solar cell sealing film. Examples of the ultraviolet absorbents include benzophenone-type ultraviolet absorbents such as 2-hydroxy-4-methoxybenzophenone, 2-hydroxy-4-n-dodecyloxybenzophenone, 2,4-dihydroxybenzophenone, and 2-hydroxy-4-n-octoxybenzophenone, to which examples are not particularly restricted. The content of the benzophenone-type ultraviolet absorbent preferably is in the range of 0.01 to 5 parts by weight based on 100 parts by weight of ethylene-polar monomer copolymer.

The composition for solar cell sealing film containing photostabilizer enables to prevent the ethylene-polar monomer copolymer from deteriorating due to light irradiation to repress yellowing of the solar cell sealing film. A hindered amine photostabilizer can be used as the photostabilizer. Examples of the photostabilizers include LA-52, LA-57, LA-62, LA-63, LA-63p, LA-67 and LA-68 (each manufactured by ADEKA Co., Ltd.), Tinuvin 744, Tinuvin 770, Tinuvin 765, Tinuvin 144, Tinuvin 622LD, and CHIMASSORB 944LD (each manufactured by Ciba Specialty Chemicals Co., Ltd.), and UV-3034 (each manufactured by B.F. Goodrich). The photostabilizers can be each used singly, or in combination of two or more kinds. The content of the photostabilizer preferably is in the range of 0.01 to 5 parts by weight based on 100 parts by weight of ethylene-polar monomer copolymer.

Examples of the antioxidants include hindered phenol-type antioxidants such as N,N'-hexan-1,6-diyl-bis[3-(3,5-di-tert-butyl-4-hydroxyphenyl)propionamide], phosphorus-type heat stabilizers, lactone-type heat stabilizers, vitamin E-type heat stabilizers and sulfur-type heat stabilizers.

The formation of the solar cell sealing film can be carried out according to known processes. The solar cell sealing film can be formed, for example, by forming the composition by using extrusion molding or calendaring. Otherwise, the solar cell sealing film can be also formed by dissolving the composition in a solvent to form a solution, applying the solution to an appropriate support by means of an appropriate coater, and then drying it to form a coated layer. The heating temperature at the film-formation preferably is in the range of 40 to 90° C., in particular 40 to 80° C. Thereafter the solar cell sealing film is generally crosslinked or cured by the application of pressure and heating to seal a solar cell.

The thickness of the solar cell sealing film generally is in the range of 50 μm to 2 mm.

The solar cell sealing film formed by use of the composition of the present invention has excellent all light beam transmittance and high transparency. The "all light beam" of the invention means light beams in the wavelength range of solar light, which generally is those in the wavelength range of 300 to 1,200 nm. The solar cell provided with this solar cell sealing film has high transmittance to incident light from outside and effectively collect the light into the solar cell and hence shows high electric power supply.

Though the structure of the solar cell of the solar cell sealing film according to the invention is particularly restricted, there can be mentioned the structure comprising a transparent front side protection material, a backside protection material and photovoltaic elements sealed therebetween by sealing films. In the invention, the front side corresponds to light-receiving side of the photovoltaic elements, whereas the backside corresponds to the reverse side of the light-receiving side of the photovoltaic elements.

The solar cell is prepared using the sealing film as shown in FIG. 1 so as to sufficiently seal the photovoltaic elements. In more detail, a transparent front side protection material 11, a front side sealing film 13A, photovoltaic elements 14, a backside sealing film 13B and backside protection material 12 are laminated and the sealing film is crosslinked or cured according to a conventional process using the application of heating and pressure.

For performance of the process using the application of heating and pressure, the laminated body can be introduced into a vacuum laminator and pressure bonded under heating in the conditions of temperature of 135 to 180° C. (preferably 140 to 180° C., especially 155 to 180° C.), degassing time period of 0.1 to 5 min., pressing pressure of 0.1 to 1.5 kg/cm² and pressing time period of 5 to 15 min. This heating enables the ethylene-polar monomer copolymer contained in the front side sealing film 13A and the backside sealing film 13B to crosslink, whereby the photovoltaic elements 14, the transparent front side protection material 11 and the backside protection material 12 are combined through the front side sealing film 13A and the backside sealing film 13B to seal the photovoltaic elements 14.

The transparent front side protection material of the invention generally is a glass plate such as silicate glass. A thickness of the glass plate is generally in the range of 0.1 to 10 mm, preferably 0.3 to 5 mm. The glass plate is tempered in heat or chemical resistance.

The backside protection material of the invention generally is a plastic film (e.g., PET), but preferably fluorinated polyethylene film (polyfluoroethylene film) or a plastic film having silver-deposited layer thereon, especially a laminated film of fluorinated polyethylene film/Al/fluorinated polyethylene film from the viewpoint of heat resistance.

The solar cell of the invention is characterized in use of the specific sealing films provided on a front side and backside. Therefore as materials used in components other than the sealing film (i.e., transparent front side protection material, backside protection material, photovoltaic elements, etc.), those used in a known solar cell can be used, which are not particularly restricted.

EXAMPLE

The invention is illustrated in detail using the following Examples. The invention is not restricted by the following Examples.

Example 1

| | | |
|---|---|---|
| (1) | EVA resin (content of vinyl acetate: 26 wt. %): | 100 wt. parts |
| (2) | Crosslinker (2,5-dimethyl-2,5-bis(t-butylperoxy)hexane): | 1.3 wt. parts |
| (3) | Crosslinking auxiliary (triallyl isocyanurate): | 2.0 wt. parts |
| (4) | Additive 1: nonaethylene glycol dimethacrylate, LIGHT-ESTER 9EG, available from KYOEISHA CHEMICAL Co., LTD): | 0.1 wt. part |

The EVA resin composition having the above-mentioned formulation was processed by calendaring process at 80° C. to prepare an EVA film (thickness: 900 µm).

Examples 2-5 and Comparison Examples 1-2

The procedures of Example 1 were repeated except for using the additive 1, additive 2 (nonaethylene glycol dimacrylate, LIGHT-ESTER 9EG-A, available from KYOEISHA CHEMICAL Co., LTD) and additive 3 (tetraethylene glycol diacrylate, LIGHT-ESTER 4EG, available from KYOEISHA CHEMICAL Co., LTD) so as to have the compositions shown in the following Table 1 to prepare the EVA resin composition and then form the sealing film.

(Evaluation)

All light beam transmittances of the sealing films obtained in Examples 1-5 and Comparison Examples 1-2 are determined according to the following procedures.

The EVA film is punched out in the size of 50 mm×50 mm. This film is interposed between glass plates (thickness: 3 mm, size: 50 mm×50 mm) to prepare a laminate of glass plate/EVA film/glass plate. The laminate is introduced into a vacuum laminator and pressure bonded under heating in vacuum in the conditions of temperature of approx. 90° C., degassing time period of 3 min. and pressing time period of 10 min., and further heated in an oven of 155° C. for 45 min., whereby EVA is crosslinked so as to have gel fraction of approx. 95%. Thereafter, light transmittance spectrum of the laminate in the thickness direction is measured in wavelength range of 300 to 1,200 nm at three points by using a spectrophotometer (U-4000, available from Hitachi, Ltd.) and an average of the three measured values is calculated. The results are shown in Table 1.

TABLE 1

| | Ex. 1 | Ex. 2 | Ex. 3 | Ex. 4 | Ex. 5 | Co. Ex. 1 | Co. Ex. 2 |
|---|---|---|---|---|---|---|---|
| EVA | 100 | 100 | 100 | 100 | 100 | 100 | 100 |
| Crosslinker | 1.3 | 1.3 | 1.3 | 1.3 | 1.3 | 1.3 | 0.65 |
| *C. Auxiliary | 2.0 | 2.0 | 2.0 | 2.0 | 2.0 | 2.0 | 1.0 |
| Additive 1 | 0.1 | 0.3 | 0.5 | 0 | 0 | 0 | 0 |
| Additive 2 | 0 | 0 | 0 | 0.5 | 0 | 0 | 0 |
| Additive 3 | 0 | 0 | 0 | 0 | 0.5 | 0 | 0 |
| All light transmittance (300-1,200 nm) | 81.14 | 81.07 | 81.05 | 80.95 | 80.97 | 80.25 | 80.15 |

*C. Auxiliary: Crosslinking Auxiliary

As apparent from the results of Table 1, the sealing film of the invention has high all light beam transmittance and excellent transparency. Further the EVA film prepared in each of Examples compares favorably with a conventional EVA film in other properties required for a solar cell sealing film such as electric insulation, sealing property, flexibility and heat and humidity resistance.

The invention claimed is:

1. A composition for a solar cell sealing film comprising ethylene-polar monomer copolymer, a crosslinker and a compound having an alkyleneoxy group, wherein the compound having an alkyleneoxy group is represented by the following formula (1):

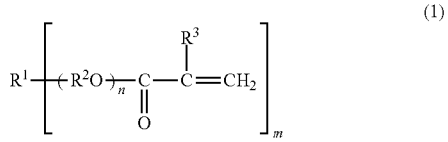

in which $R^2$ represents a substituted or unsubstituted alkylene group, $R^3$ represents a hydrogen atom or a methyl group, n is an integer of 1 to 30, m is an integer of 1 to 3, $R^1$ represents an alkoxy group, an aryloxy group, a phosphoric acid group, a phosphate ester group, a methacryloyl-ethoxy phosphoric acid group, a acryloyl-ethoxy phosphoric acid group, an acryloyloxy group or a methacryloyloxy group provided that m is 1, $R^1$ represents a divalent aliphatic hydrocarbon group provided that m is 2, and $R^1$ represents a trivalent aliphatic hydrocarbon group provided that m is 3, wherein the compound having an alkyleneoxy group is contained in an amount of 0.05 to 0.6 parts by weight based on 100 parts by weight of the ethylene-polar monomer copolymer, and wherein triallyl isocyanurate is further contained in an amount of 0.1 to 3.0 parts by weight based on 100 parts by weight of the ethylene-polar monomer copolymer.

2. A composition for a solar cell sealing film as defined in claim 1, wherein $R^2$ of the formula (I) represents an ethylene group or a group represented by —$CH_2CH(CH_3)$—.

3. A composition for a solar cell sealing film as defined in claim 1, wherein n of the formula (1) is an integer of 1 to 16.

4. A composition for a solar cell sealing film as defined in claim 1, wherein m of the formula (1) is 1 and $R^1$ represents an acryloyloxy group or a methacryloyloxy group.

5. A composition for a solar cell sealing film as defined in claim 1, wherein the compound having an alkyleneoxy group is nonaethyleneglycol di(meth)acrylate and/or tetraethyleneglycol di(meth)acrylate.

6. A composition for a solar cell sealing film as defined in claim 1, wherein the ethylene-polar monomer copolymer is ethylene-vinyl acetate copolymer.

7. A solar cell sealing film obtained from a composition for a solar cell sealing film as defined in claim 1.

8. A solar cell comprising a transparent front side protection material, a backside protection material and photovoltaic elements sealed therebetween by a sealing film, these being combined with each other by crosslinking of the sealing film, wherein the sealing film is a solar cell sealing film as defined in claim 7.

* * * * *